United States Patent

Tsuno

[11] Patent Number: 4,485,150
[45] Date of Patent: Nov. 27, 1984

[54] METAL CERAMICS COMPOSITES AND A METHOD FOR PRODUCING SAID COMPOSITES

[75] Inventor: Nobuo Tsuno, Kasugai, Japan

[73] Assignee: NGK Insulators, Ltd., Japan

[21] Appl. No.: 413,132

[22] Filed: Aug. 30, 1982

[30] Foreign Application Priority Data

Dec. 9, 1981 [JP] Japan ............................... 56-197005

[51] Int. Cl.³ ....................... B32B 31/26; B23K 31/02
[52] U.S. Cl. .................................... 428/633; 428/552; 428/553; 428/564; 428/632; 428/639; 428/664; 428/665; 428/681; 428/472; 75/252
[58] Field of Search ............... 428/552, 553, 564, 632, 428/633, 639, 664, 665, 681, 472; 228/263.12; 75/252

[56] References Cited

U.S. PATENT DOCUMENTS

| | | | |
|---|---|---|---|
| 3,403,043 | 9/1968 | Thompson | 428/633 |
| 3,556,843 | 1/1971 | Buck | 117/227 |
| 3,889,041 | 6/1975 | Mase | 428/472 |
| 3,927,815 | 12/1975 | Mase | 228/121 |

FOREIGN PATENT DOCUMENTS

2350465  4/1975  Fed. Rep. of Germany .
386875   6/1973  U.S.S.R. .

*Primary Examiner*—Veronica O'Keefe
*Attorney, Agent, or Firm*—Parkhurst & Oliff

[57] ABSTRACT

Metal ceramics composites having high bonding strength wherein a metal body and a ceramics body are bonded through a bonding layer are produced by coating on the ceramic body a metallizing layer-forming composition, which forms through heat treatment with the ceramic body a metallizing layer consisting essentially of 70–90% by weight of at least one of molybdenum metal and tungsten metal, 0.5–15% by weight of manganese oxide, 0.1–10% by weight of yttrium oxide, 0.1–15% by weight of aluminum oxide and 0.1–15% by weight of silicon dioxide, heating the ceramic body and the coated metallizing layer-forming composition to form and adhere the metallizing layer on the ceramic body, applying metal plating on either or both of the metallizing layer surface to be bonded and the metal body surface to be bonded, and bonding the thus obtained ceramic body and metal body by using a brazing metal.

8 Claims, 1 Drawing Figure

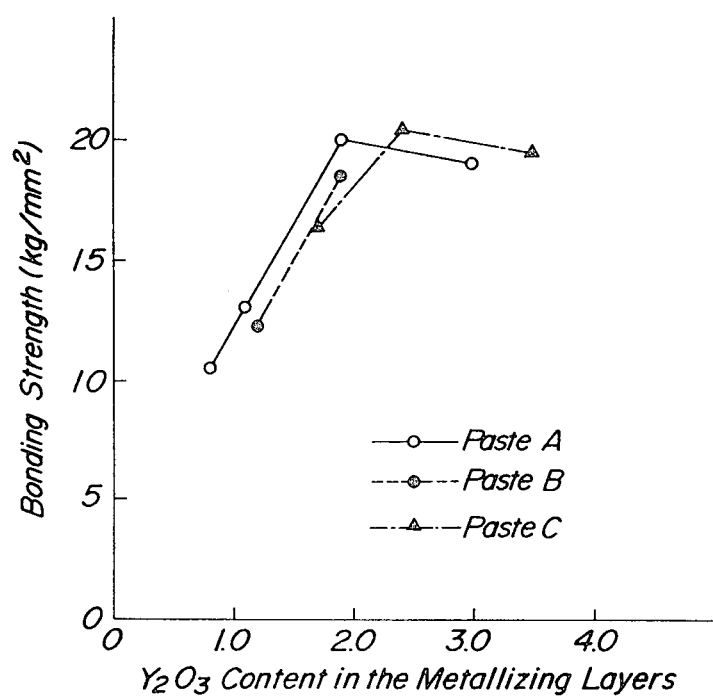

METAL CERAMICS COMPOSITES AND A METHOD FOR PRODUCING SAID COMPOSITES

BACKGROUND OF THE INVENTION

1. Field of the Invention

The present invention relates to metal ceramic composites having excellent mechanical strength properties and a method for producing said composites.

2. Description of the Prior Art

Heretofore, metal ceramics composites having metal and a ceramics bonded through a metallizing layer, have been used for semiconductor integrated circuit parts, electronic circuit substrates or envelopes for electron tubes.

These metal ceramic composites are produced by carrying out metallizing processing on surfaces of a ceramic body, then effecting metal plating thereon and brazing the thus treated ceramic body with a metal body by using a brazing metal. Accordingly, between the metal body and the ceramic body of such a composite there is a bonding layer consisting of a metallizing layer, a metal plating layer and a brazing layer.

The bonding strength of the thus obtained metal ceramic composite is highly influenced by the properties of the metallizing layer which is an element for composing the bonding layer.

As compositions of the metallizing layer used for these metal ceramic composites, for example, those consisting of at least one metal of Mo, W, Mn, Fe, Ni, Co, etc. and at least one oxide of MnO, $SiO_2$, $Al_2O_3$, CaO, MgO, BeO, etc. have been well known and among them, a metallizing layer having a composition consisting of Mo metal, MnO, $SiO_2$ and $Al_2O_3$ has been broadly used as the metallizing layer by which a metal ceramic composite having high reliability can be obtained.

However, in prior metal ceramics composites, excellent gastightness is the most important requirement, so that as the metallizing layer to be used therefor, the layer having the similar coefficient of thermal expansion to the ceramics to be bonded is selected and the composition containing oxides showing a viscosity similar liquid at a relatively low firing temperature is preferable. Metal ceramics composites bonded through prior metallizing layers do not have high enough strength to be used as high strength mechanical parts.

Recently, an increasing the need for the application of ceramics to machine parts, has required the metal ceramic composites to have high bonding strengths between the metal and ceramic.

SUMMARY OF THE INVENTION

The present invention has as a goal to provide metal ceramic composites which satisfy the above described demands and solve the problems and defects of metal ceramics composites bonded through prior metallizing layer. The composites must have a very high bonding strength even at a relatively low firing temperatures for a metallizing layer, and a method for producing said metal ceramics composites. That is, the present invention lies in metal ceramics composites wherein a metal and a ceramic are integrally bonded through a metallizing layer consisting essentially of 70-90% by weight of at least one of molybdenum metal and tungsten metal, 0.5-15% by weight of manganese oxide, 0.1-10% by weight of yttrium oxide, 0.1-15% by weight of aluminum oxide and 0.1-15% by weight of silicon dioxide and a method for producing said metal ceramic composites. More particularly, the present invention lies in metal ceramic composites having excellent mechanical strength, wherein a metal body composed of preferably, nodular cast iron and various ceramic bodies, such as zirconia, alumina and the like are integrally bonded through a particularly defined metallizing layer containing at least given amounts of molybdenum meal, tungsten metal, manganese oxide, yttrium oxide, aluminum oxide and silicon dioxide.

BRIEF DESCRIPTION OF THE DRAWING

For a better understanding of the invention, reference is taken to the accompanying drawing, wherein:

FIG. 1 is a graph showing the relation of the bonding strength to the content of yttrium oxide in the metallizing layers when a paste containing no yttrium oxide and a paste containing yttrium oxide are used.

DESCRIPTION OF THE PREFERRED EMBODIMENTS

The metals composing the metallizing layer involve at least one metal such as molybdenum or tungsten. These metals have a high melting point and are not embrittled by components in heating atmosphere nor do they react with the components in the atmosphere, The metals have a coefficient of thermal expansion in a range of $4-10 \times 10^{-6}(1/°C.)$ which is close to that of ceramics, so that these metals are most preferable.

However, when an amount of at least one of molybdenum metal and tungsten metal is less than 70% by weight, an amount of the oxides in the metallizing layer is too much and it is impossible to obtain a strong bond with a brazing metal and particularly, when a metal plating is applied to the metallizing layer in the subsequent step, the adhesion of the metal plating becomes non-uniform and the strong bond to the brazing metal cannot be obtained. Hence such an amount is not preferable. When the content of these metals exceeds 90%, an amount of oxides which promote the sintering and form the strong bond with ceramics, is deficient and the bonding strength is reduced. Hence, this percentage amount is also not preferable. Manganese oxide is necessary as an oxide component which bonds the metallizing layer to the ceramic body and promotes the sintering of Mo or W in the metallizing layer. When the content of manganese oxide in the metallizing layer is less than 0.5% or exceeds 15%, the softening temperature of the oxides becomes high. This requires heating at a high firing temperature for adhesion of the metallizing layer to the ceramic body, causing the properties of the ceramic body vary, so that such amounts are not preferable. Manganese oxide in the metallizing layer may be initially added in the metallizing layer-forming composition. However, when manganese oxide is contained only in the ceramic body which forms the composite, manganese oxide diffuses into the metallizing layer from the ceramic body when the metallizing layer is adhered to the ceramic body. The amount of manganese oxide which is diffused from the ceramic body may be reduced by increasing the amount of manganese oxide initially added.

Furthermore, it is possible to selectively oxidize only manganese meal, which is added to the metallizing layer-forming composition, into manganese oxide without oxidizing Mo or W by controlling the oxygen partial pressure or water vapor pressure in atmosphere when heating the ceramic body to adhere the metallizing layer to the ceramic body.

In addition, it is essential for the metal ceramic composite having excellent mechanical strength, according to the present invention, to contain yttrium oxide in the metallizing layer. As in the above described manganese oxide, when yttrium oxide is contained in the ceramic body, a part of said oxide is diffused out into the metallizing layer, so that in such a case, an amount of said oxide corresponding to that to be diffused, is reduced and initially added to the metallizing layer-forming composition. However, if the content of yttrium oxide in the metallizing layer is less than 0.1%, the bonding strength is not improved and such an amount is not preferable. When the content of yttrium oxide exceeds 10%, the melting point of the oxides becomes higher and the heating for adhering the metallizing layer to the ceramic body requires a high temperature, causing the properties of the ceramic body to vary, so that such an amount is also not preferable.

Aluminum oxide and silicon dioxide in the metallizing layer are necessary as the components for composing $MnO-Al_2O_3-SiO_2-Y_2O_3$ system oxides and when each content of aluminum oxide and silicon dioxide in the metallizing layer is less than 0.1% or exceeds 15%, the melting point of $MnO-Al_2O_3-SiO_2-Y_2O_3$ system oxides becomes higher and heating at a high temperature is required for adhering the metallizing layer to the ceramic body, causing the properties of the ceramic body to vary, so that such an amount is also not preferable.

Furthermore, aluminum oxide and silicon dioxide may be diffused into the metallizing layer from the ceramic body as in the case of the above described manganese oxide and yttrium oxide. In such a case, the amount in which the amount corresponding to the diffusing amount is reduced, is added to the metallizing layer-forming composition. When, as mentioned above, manganese oxide, yttrium oxide, aluminum oxide or silicon dioxide are contained in the ceramic body and are diffused and transferred into the metallizing layer and all the necessary amounts are included in the diffusing and transferring amount, of course, it is not necessary to previously add these oxides to the metallizing layer-forming composition.

In this case, the amount of the oxides which are diffused and transferred from the ceramic body to the metallizing layer, varies depending upon the composition of the metallizing layer-forming composition, the temperature and the heating time for adhering the metallizing layer and the composition of the ceramic body. By taking these conditions into consideration, the composition or heating condition of the metallizing layer-forming composition is determined. The metallizing layer composing the composite of the present invention may contain about less than 10% of various metal oxides, such as calcium oxide, magnesium oxide, titanium oxide, zirconium oxide, iron oxide and the like as impurities.

It is considered that a portion of or all of the oxides contained in the metallizing layer of the present invention forms a solid solution of spessartites which is one type of garnet. This improves the bonding strength and the high-temperature strength of the bonding layer. In these spessartites, the melting point continuously rises with increase of the content of yttrium oxide and aluminum oxide, so that in the heating step for adhering the metallizing layer to the ceramic body, a phase of oxide having a low melting point is firstly formed to wet the ceramic body surface and react therewith and further to promote the sintering of molybdenum metal or tungsten metal. Then, as the heating time proceeds, yttrium oxide forms a solid solution with the above described oxide phase and a garnet solid solution is formed. As an amount of yttrium oxide in the solid solution is increased, a garnet solid solution having a high melting point and a high strength is presumably formed.

A method for bonding a metal body and a ceramic body is as follows. For example, the metallizing layer is adhered to a ceramic body surface by heating under wet hydrogen atmosphere, nickel plating is effected thereon and a metal body, wherein nickel plating has been effected at one end, is brazed to the metallizing layer by means of silver-copper brazing alloy. In this case, the nickel plating is effected in order to improve the wettability of the brazing alloy with the metallizing layer or the metal body and the metal plating material is selected depending upon the brazing metal to be used or the material of the metal body to be bonded and if necessary, a plating of a metal in which the quality is different, may be doubly effected. The brazing metal may be selected from conventionally available brazing metals depending upon the quality of the metal body to be bonded or the using circumstances, such as the temperature and atmosphere, when the metal ceramic composite is used.

The combination of a metal and a ceramic composing the metal ceramic composite of the present invention may be determined by considering mechanical properties, such as strength, hardness, elastic modulus and the like of the metal and ceramic and physical properties, such as heat resistance, corrosion resistance, coefficient of thermal expansion and the like depending upon the intended use of the material. The metal and the ceramics to be combined preferably have a coefficient of thermal expansion which is very similar. However, for example, when a metal having a low elastic modulus as in copper is used, even if the difference of coefficient of thermal expansion is large, a composite having a high bonding strength can be obtained.

Even when the difference of the coefficient of thermal expansion is large, the composites having a high bonding strength can be obtained by moderating preferable stresses due to the difference of thermal expansion, by selecting a brazing metal having a low brazing temperature, carrying out ageing heat treatment or effecting the brazing in the presence of a separate metal plate having an intermediate coefficient of thermal expansion between the metal body and the ceramic body.

The adhering of the metallizing layer on the ceramic body surface may be effected by applying a paste containing a metallizing layer-forming composition on a fired ceramic body surface and effecting heating, or applying the above described paste on a green ceramic shaped body surface and then effecting heating to concurrently carry out firing of the ceramic shaped body and adhering of the metallizing layer.

The following examples are given for the purpose of illustration of this invention and are not intended as limitations thereof. The percent (%) used herein means "weight percent".

EXAMPLE 1

A paste-like metallizing layer-forming composition (paste A) containing 80% of molybdenum metal, 10% of manganese metal, 10% of silicon dioxide, a paste-like metallizing layer-forming composition (paste B) containing 80% of molybdenum metal, 10% of manganese metal, 9.5% of silicon dioxide and 0.5% of yttrium oxide and a paste-like metallizing layer-forming composition (paste C) containing 80% of molybdenum metal, 10% of manganese metal, 9% of silicon dioxide and 1% of ytrrium oxide were respectively coated on both surfaces of yttrium oxide-containing partially stabilized zirconia ceramic disc (shown in Table 3) having a diameter of 7.5 mm and a height of 5 mm. The paste thickness was approximately 0.1 mm, and it was heated at 90° C. for 1 hour to dry the paste and then heated under a mixed gas atmosphere of hydrogen and nitrogen passed through a water tank heated at 40° C. under the conditions shown in the following Table 1 to form metallizing layers on the disc.

Nickel plating was applied on the metallizing layer surface and then thus treated disc and a round rod of nodular cast iron (referred to as FCD hereinafter) which was nickel plated, were integrally brazed by using a silver-copper brazing alloy under a vacuum. This composite was machined to obtain a rod-shaped test piece having a diameter of 5 mm and a length of 65 mm and said test piece was subjected to a tensile test (defined by JIS Z 2201) to determine the bonding strength and the obtained results are shown in the following Table 1. An analysis was effected by means of X-ray microanalyzer with respect to the vertical cross-section of the bonded portion of each test piece to determine an amount of yttrium oxide in the metallizing layer and the obtained results are shown in Table 1 and FIG. 1. As seen from FIG. 1, even in the metallizing layer obtained by the paste A which originally did not contain any yttrium oxide, there is yttrium oxide which was diffused from the zirconia ceramics and the bonding strength of this metallizing layer is the same degree as in the metallizing layer obtained by the pastes B and C originally containing yttrium oxide.

TABLE 1

| Paste | Heating condition Temperature (°C.) | Time (H) | Bonding strength (kg/mm$^2$) | Y$_2$O$_3$ content in metallizing layer (wt %) |
|---|---|---|---|---|
| A | 1,300 | 5 | 10.5 | 0.8 |
| A | 1,300 | 10 | 13.0 | 1.1 |
| A | 1,300 | 20 | 20.0 | 1.9 |
| A | 1,350 | 20 | 19.0 | 3.0 |
| B | 1,300 | 5 | 13.0 | 1.2 |
| B | 1,300 | 10 | 18.5 | 1.9 |
| C | 1,300 | 5 | 16.5 | 1.7 |
| C | 1,300 | 10 | 20.5 | 2.4 |
| C | 1,300 | 20 | 19.5 | 3.5 |

EXAMPLE 2

Each powdery composition for forming metallizing layers consists of the components shown in Table 2, was mixed and stirred with an organic binder, such as dibutyl phthalate, butyl carbitol, acetone and the like to prepare a paste and the paste was applied on both surfaces of a disc-shaped ceramics having a diameter of 7.5 mm and a height of 5 mm and consisting of the composition shown in Table 3. The paste thickness was of about 0.1 mm and it was dried by heating at 90° C. for 1 hour and then heated in wet mixed gas atmosphere of hydrogen and nitrogen passed through a water tank heated at 40° C. under a heating condition shown in Table 4, to obtain a metallizing layer having the composition shown in Table 4.

TABLE 2

| No. | Mo | W | Mn | Al$_2$O$_3$ | SiO$_2$ | Y$_2$O$_3$ |
|---|---|---|---|---|---|---|
| 1 | 90 | — | 5 | — | 5 | — |
| 2 | 90 | — | 5 | 5 | — | — |
| 3 | 80 | — | 10 | — | 10 | — |
| 4 | 80 | — | 10 | 10 | — | — |
| 5 | 80 | — | 10 | 5 | 5 | — |
| 6 | 80 | — | 10 | — | 9.5 | 0.5 |
| 7 | 80 | — | 10 | — | 9.0 | 1.0 |
| 8 | 75 | — | 10 | — | 10 | 5 |
| 9 | 75 | — | 10 | 10 | — | 5 |
| 10 | 75 | — | 10 | — | 5 | 10 |
| 11 | 75 | — | 10 | 5 | — | 10 |
| 12 | — | 80 | 10 | 5 | 5 | — |
| 13 | 40 | 40 | 10 | 5 | 5 | — |
| 101 | 80 | — | 20 | — | — | — |
| 102 | 70 | — | 10 | 10 | 10 | — |

TABLE 3

| Ceramics | Composition of ceramics (wt %) | | | | | | | | |
|---|---|---|---|---|---|---|---|---|---|
| | SiO$_2$ | Al$_2$O$_3$ | MgO | CaO | Fe$_2$O$_3$ | ZrO$_2$ | Y$_2$O$_3$ | TiO$_2$ | BeO |
| Zirconia | 1.7 | 0.89 | 0.01 | 0.05 | — | 87.5 | 9.0 | 0.19 | — |
| Alumina | 5.3 | 92.9 | 0.9 | 0.9 | — | — | — | — | — |
| Magnesia | 2.5 | 3.9 | 91.3 | 2.3 | — | — | — | — | — |
| Beryllia | 0.25 | 0.15 | 0.02 | 0.07 | 0.01 | — | — | — | 99.5 |
| Steatite | 62.5 | 12.8 | 24.7 | — | — | — | — | — | — |
| Forsterite | 39.8 | 5.2 | 54.4 | 0.2 | 0.4 | — | — | — | — |
| Mullite | 28.2 | 71.8 | — | — | — | — | — | — | — |

TABLE 4

| | No. | Composition number in Table 2 | Ceramics in Table 3 | Heating condition Temperature (°C.) | Time (H) | Analyzed value of metallizing layer (wt %) | | | | | | Bonding metal | Bonding strength (kg/mm$^2$) |
|---|---|---|---|---|---|---|---|---|---|---|---|---|---|
| | | | | | | Mo | W | MnO | Al$_2$O$_3$ | SiO$_2$ | Y$_2$O$_3$ | | |
| Present invention | 1 | 1 | Zirconia | 1,300 | 5 | 87.8 | — | 6.2 | 0.8 | 4.4 | 0.8 | FCD | 10.0 |
| | 2 | 1 | Zirconia | 1,300 | 10 | 87.7 | — | 6.1 | 0.8 | 4.2 | 1.2 | FCD | 13.0 |
| | 3 | 2 | Zirconia | 1,300 | 5 | 87.3 | — | 6.1 | 4.7 | 1.1 | 0.8 | FCD | 9.0 |
| | 4 | 2 | Zirconia | 1,300 | 10 | 86.8 | — | 6.1 | 4.4 | 1.6 | 1.1 | FCD | 12.0 |
| | 5 | 3 | Zirconia | 1,300 | 5 | 77.0 | — | 12.5 | 0.9 | 8.8 | 0.8 | FCD | 10.5 |

TABLE 4-continued

| | No. | Composition number in Table 2 | Ceramics in Table 3 | Heating condition Temperature (°C.) | Time (H) | Mo | W | MnO | Al₂O₃ | SiO₂ | Y₂O₃ | Bonding metal | Bonding strength (kg/mm²) |
|---|---|---|---|---|---|---|---|---|---|---|---|---|---|
| | 6 | 3 | Zirconia | 1,300 | 10 | 76.8 | — | 12.5 | 1.0 | 8.6 | 1.1 | FCD | 13.0 |
| | 7 | 3 | Zirconia | 1,300 | 20 | 76.4 | — | 12.4 | 0.9 | 8.4 | 1.9 | FCD | 20.0 |
| | 8 | 3 | Zirconia | 1,350 | 20 | 75.4 | — | 12.3 | 0.9 | 8.4 | 3.0 | FCD | 19.0 |
| | 9 | 4 | Zirconia | 1,300 | 10 | 75.9 | — | 12.4 | 9.0 | 1.6 | 1.1 | FCD | 14.0 |
| | 10 | 4 | Zirconia | 1,300 | 20 | 75.3 | — | 12.2 | 8.8 | 1.7 | 2.0 | FCD | 20.0 |
| | 11 | 5 | Zirconia | 1,300 | 20 | 77.2 | — | 12.5 | 4.1 | 4.3 | 1.9 | FCD | 20.0 |
| | 12 | 6 | Zirconia | 1,300 | 5 | 77.1 | — | 12.2 | 0.9 | 8.6 | 1.2 | FCD | 13.0 |
| | 13 | 6 | Zirconia | 1,300 | 10 | 76.5 | — | 12.4 | 1.1 | 8.1 | 1.9 | FCD | 18.5 |
| | 14 | 7 | Zirconia | 1,300 | 5 | 76.8 | — | 12.4 | 0.9 | 8.2 | 1.7 | FCD | 16.5 |
| | 15 | 7 | Zirconia | 1,300 | 10 | 76.5 | — | 12.4 | 1.1 | 7.6 | 2.4 | FCD | 20.5 |
| | 16 | 7 | Zirconia | 1,300 | 20 | 75.4 | — | 12.3 | 1.4 | 7.4 | 3.5 | FCD | 19.5 |
| | 17 | 8 | Zirconia | 1,300 | 1 | 72.4 | — | 12.5 | 0.7 | 9.4 | 5.0 | FCD | 19.0 |
| | 18 | 9 | Zirconia | 1,400 | 1 | 72.2 | — | 12.5 | 9.3 | 0.9 | 5.1 | FCD | 21.0 |
| | 19 | 10 | Zirconia | 1,400 | 1 | 72.3 | — | 12.5 | 0.8 | 4.7 | 9.7 | FCD | 12.0 |
| | 20 | 11 | Zirconia | 1,400 | 1 | 72.2 | — | 12.5 | 4.7 | 0.7 | 9.9 | FCD | 11.0 |
| | 21 | 12 | Zirconia | 1,300 | 20 | — | 77.2 | 12.5 | 4.0 | 4.5 | 1.8 | FCD | 18.0 |
| | 22 | 13 | Zirconia | 1,300 | 20 | 38.4 | 38.5 | 12.5 | 4.1 | 4.6 | 1.9 | FCD | 19.0 |
| | 23 | 3 | Zirconia | 1,300 | 5 | 77.0 | — | 12.5 | 0.9 | 8.8 | 0.8 | Copper | 11.0 |
| | 24 | 3 | Zirconia | 1,300 | 20 | 76.4 | — | 12.4 | 0.9 | 8.4 | 1.9 | Copper | 23.0 |
| | 25 | 10 | Zirconia | 1,400 | 1 | 72.3 | — | 12.5 | 0.8 | 4.7 | 9.7 | Copper | 14.0 |
| | 26 | 8 | Alumina | 1,300 | 5 | 70.3 | — | 12.2 | 3.9 | 8.9 | 4.7 | Steel | 17.0 |
| | 27 | 9 | Alumina | 1,400 | 1 | 71.9 | — | 12.5 | 9.4 | 1.4 | 4.8 | Steel | 15.0 |
| | 28 | 10 | Alumina | 1,400 | 1 | 71.2 | — | 12.4 | 2.4 | 4.7 | 9.3 | Steel | 14.0 |
| | 29 | 11 | Alumina | 1,400 | 1 | 71.7 | — | 12.4 | 5.4 | 1.3 | 9.2 | Steel | 13.0 |
| | 30 | 8 | Alumina | 1,300 | 1 | 72.2 | — | 12.5 | 1.1 | 9.4 | 4.8 | FCD | 14.0 |
| | 31 | 10 | Alumina | 1,400 | 1 | 71.2 | — | 12.4 | 2.4 | 4.7 | 9.3 | FCD | 12.0 |
| | 32 | 8 | Alumina | 1,300 | 5 | 70.3 | — | 12.2 | 3.9 | 8.9 | 4.7 | Copper | 19.0 |
| | 33 | 9 | Alumina | 1,400 | 1 | 71.9 | — | 12.5 | 9.0 | 1.4 | 4.8 | Copper | 16.0 |
| | 34 | 8 | Magnesia | 1,300 | 1 | 71.5 | — | 12.4 | 0.5 | 10.5 | 5.1 | Copper | 17.5 |
| | 35 | 10 | Magnesia | 1,400 | 1 | 71.8 | — | 12.4 | 0.5 | 5.7 | 9.6 | Copper | 11.0 |
| | 36 | 8 | Beryllia | 1,300 | 1 | 72.5 | — | 12.4 | 0.2 | 10.1 | 4.8 | Copper | 18.5 |
| | 37 | 9 | Beryllia | 1,400 | 1 | 72.4 | — | 12.5 | 10.1 | 0.2 | 4.8 | Copper | 18.0 |
| | 38 | 8 | Steatite | 1,300 | 1 | 71.4 | — | 12.3 | 1.0 | 10.5 | 4.8 | Copper | 17.0 |
| | 39 | 10 | Steatite | 1,400 | 1 | 71.2 | — | 12.2 | 1.4 | 5.7 | 9.5 | Copper | 11.5 |
| | 40 | 9 | Forsterite | 1,400 | 1 | 71.3 | — | 12.2 | 10.4 | 1.4 | 4.7 | Copper | 16.5 |
| | 41 | 11 | Forsterite | 1,400 | 1 | 71.6 | — | 12.3 | 5.2 | 1.4 | 9.5 | Copper | 11.0 |
| | 42 | 8 | Mullite | 1,300 | 1 | 70.6 | — | 12.1 | 2.3 | 10.3 | 4.7 | Copper | 19.0 |
| | 43 | 9 | Mullite | 1,400 | 1 | 70.1 | — | 12.1 | 11.2 | 1.9 | 4.7 | Copper | 16.0 |
| Comparative example | 51 | 3 | Alumina | 1,300 | 20 | 75.5 | — | 12.2 | 1.9 | 10.4 | — | FCD | 4.7 |
| | 52 | 4 | Alumina | 1,300 | 20 | 74.8 | — | 12.1 | 11.2 | 1.9 | — | FCD | 4.5 |
| | 53 | 3 | Magnesia | 1,300 | 20 | 75.9 | — | 12.3 | 1.4 | 10.4 | — | Copper | 4.0 |
| | 54 | 4 | Magnesia | 1,300 | 20 | 75.9 | — | 12.3 | 10.4 | 1.4 | — | Copper | 3.5 |
| | 55 | 3 | Beryllia | 1,300 | 20 | 77.2 | — | 12.5 | 0.2 | 10.1 | — | Copper | 5.2 |
| | 56 | 4 | Beryllia | 1,300 | 20 | 77.3 | — | 12.5 | 9.7 | 0.5 | — | Copper | 4.6 |
| Conventional example | 101 | 101 | Alumina | 1,400 | 1 | 70.5 | — | 22.9 | 3.1 | 3.5 | — | Copper | 6.0 |
| | 102 | 101 | Alumina | 1,450 | 1 | 69.3 | — | 22.5 | 3.9 | 4.3 | — | Copper | 5.5 |
| | 103 | 102 | Alumina | 1,400 | 1 | 66.4 | — | 11.8 | 11.3 | 10.5 | — | Copper | 5.0 |
| | 104 | 102 | Alumina | 1,450 | 1 | 64.2 | — | 11.6 | 12.5 | 11.7 | — | Copper | 5.5 |

In this case, the difference of the composition of the paste and the composition of the metallizing layer is due to the diffusion and transfer of the components from the used ceramics. Nickel plating was effected on the metallizing layer surface and then a round metal rod having a diameter of 7 mm and a length of 30 mm to be brazed as shown in Table 4, which has been nickel plated, was brazed to the thus treated ceramic disc by heating under vacuum by using a silver-copper brazing alloy. The thus obtained composite was machined to obtain a rod-shaped test piece having a diameter of 5 mm and a length of 65 mm. This test piece was subjected to a tensile test to determine the bonding strength and the obtained results are shown in Table 4. For comparison, the measurement was effected with respect to the comparative samples which are beyond the scope of the numeral limitation of the present invention and the reference examples of conventional articles.

As seen from the results of Table 4, Nos. 1–11 show that when the metallizing layer-forming compositions containing no yttrium oxide are applied on zirconia ceramics containing yttrium oxide and the metallizing layer is formed, the high bonding strengths can be obtained by controlling an amount of yttrium oxide diffused into the metallizing layer by adjusting the heating condition to control an amount of yttrium oxide contained in the metallizing layer within the scope of the present invention. Nos. 12–20 are examples when the metallizing layers are formed on zirconia ceramics containing yttrium oxide by using the metallizing layer-forming compositions containing yttrium oxide and this case shows that the high bonding strength can be obtained by heating for a short time. Nos. 21–25 show that even when a part or the entire of molybdenum in the metallizing layer is substituted with tungsten or the metal to be bonded is replaced from FCD to copper, the bonding strength does not vary. Nos. 26–43 are examples wherein the metallizing layer-forming compositions containing yttrium oxide are applied on alumina, magnesia, beryllia, steatite, forsterite or mullite to form the metallizing layers and show that the high bonding strength can be obtained by the metallizing layers of the present invention irrespective of to the kind of ceramics being used.

Nos. 51-56 are the comparative examples which are beyond the scope of the numerical limitations of the present invention and in which the metallizing layer-forming compositions containing no yttrium oxide are applied on various ceramics not containing yttrium oxide to form the metallizing layers. These examples show that when the composition of the metallizing layer is beyond the scope of the present invention, the bonding strength is very low irrespective of the kind of ceramics.

Nos. 101-104 are the conventional articles wherein the well known metallizing layer-forming compositions are applied on alumina ceramics and the metallizing layers are formed in the same manner as in the example of the present invention. It was confirmed that the strength is noticeably lower than that of the composites of the present invention.

As mentioned above, the metal ceramics composites of the present invention have a superior bonding strength to the conventional metal ceramic composites and this high strength can be obtained even when the combination of the metal and the ceramics which are bonded is varied and metal ceramic composites having numerous merits can be obtained. By utilizing the high strength of the composites and the heat resistance, thermal insulation, corrosion resistance and abrasion resistance of ceramics, the composites of the present invention are very commercially useful as mechanical parts, such as automotive engine parts which are subjected to high temperatures, repeating load and impact load, for example, cylinder, piston, suction valve, exhaust valve, exhaust manifold, turbocharger, tappet and connecting rod, and further are useful as device parts for chemical industry, such as jet engine parts, gas turbine parts or pumps for chemical industry.

What is claimed is:

1. Metal ceramic composites having a metal body and a ceramic body bonded together through a bonding layer, said bonding layer being applied on a surface of the ceramic body and provided with a metallizing layer consisting essentially of 70-90% by weight of a metal selected from the group consisting of molybdenum and tungsten, 0.5-15% by weight of manganese oxide, 0.1-10% by weight of yttrium oxide, 0.1-15% by weight of aluminum oxide and 0.1-15% by weight of silicon dioxide.

2. Metal ceramic composites as claimed in claim 1, wherein either or both of the metallizing layer and the metal body are provided with a metal plating layer and bonded by using a brazing metal.

3. Metal ceramic composites as claimed in claim 1 or 2, wherein the ceramic body is zirconia ceramics and the metal body is nodular cast iron.

4. Metal ceramic composites as claimed in claim 3, wherein the zirconia ceramic is yttrium oxide-containing partially stabilized zirconia ceramics.

5. Metal ceramic composites having a nodular cast iron metal body and a zirconia ceramic body bonded together through a bonding layer, said bonding layer being applied on a surface of the zirconia ceramic body surface and provided with a metallizing layer consisting essentially of 70-90% by weight of a metal selected from the group consting of molybdenum and tungsten, 0.5-15% by weight of magnanese oxide, 0.1-10% by weight of yttrium oxide, 0.1-15% by weight of aluminum oxide and 0.1-15% by weight of silicon dioxide, wherein a metal plating layer is provided on a surface selected from the group consisting of a surface on the metallizing layer and a surface on the nodular cast iron body, whereby said metallizing layer and nodular cast iron body are bonded by a brazing metal.

6. Metal ceramic composites having a nodular cast iron metal body and a yttrium oxide-containing partially stabilizer zirconia bonded together through a bonding layer, said bonding layer being applied on a surface of the partially stabilized zirconia body and provided with a metallizing layer consisting essentially of 70-90% by weight of a metal selected from the group consisting of molybdenum and tungsten, 0.5-15% by weight of magnanese oxide, 0.1-10% by weight of yttrium oxide, 0.1-15% by weight of aluminum oxide and 0.1-15% by weight of silicon dioxide, wherein a metal plating layer is provided on a surface selected from the group consisting of a surface on the metallizing layer and a surface on the nodular cast iron body, whereby said metallizing layer and nodular cast iron body are bonded by a brazing metal.

7. Metal ceramic composites having a metal body and a ceramic body bonded together through a bonding layer, said bonding layer being applied on a surface of the ceramic body and provided with a metallizing layer consisting essentially of 70-90% by weight of a metal selected from the group consisting of molybdenum and tungsten, 0.5-15% by weight of magnanese oxide, 0.1-10% by weight of yttrium oxide, 0.1-15% by weight of aluminum oxide and 0.1-15% by weight of silicon dioxide made by the method of:

coating a metallizing layer-forming composition on the ceramic body, said metallizing layer-forming composition forming the metallizing layer containing at least 70-90% by weight of a metal selected from the group consisting of molybdenum and tungsten, magnanese metal in a amount sufficient to form 0.5-15% by weight of magnanese oxide, 0.1-15% by weight of aluminum oxide and 0.1-15% by weight of silicon dioxide;

heating the ceramic body and the coated metallizing layer-forming composition to melt said oxides of the layer-forming composition and adhering the metallizing layer onto the ceramic body;

applying metal plating on a surface selected from the group consisting of the metallizing layer surface and a metal body surface which is to be bonded to the metallizing layer surface; and bonding the thus obtained ceramic body to the metal body by using a brazing metal.

8. The method of claim 7, wherein the ceramic body contains at least one oxide selected from the group consisting of magnanese oxide, yttrium oxide, aluminun oxide and silicon dioxide and when said oxides comprising the metallizing layer-forming composition become a liquid, the oxides contained in the ceramic body diffuse and penetrate into the metallizing layer.

* * * * *